(12) United States Patent  (10) Patent No.: US 6,706,592 B2
Chern et al.  (45) Date of Patent: Mar. 16, 2004

(54) SELF ALIGNED METHOD OF FORMING A SEMICONDUCTOR ARRAY OF NON-VOLATILE MEMORY CELLS

(75) Inventors: Geeng-Chuan Michael Chern, Cupertino, CA (US); Chien-Sheng Su, Saratoga, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 15 days.

(21) Appl. No.: 10/146,569

(22) Filed: May 14, 2002

(65) Prior Publication Data

US 2003/0215999 A1 Nov. 20, 2003

(51) Int. Cl.$^7$ .............................................. H01L 21/336
(52) U.S. Cl. ...................................... 438/257; 438/259
(58) Field of Search ................................ 438/257, 258, 438/259, 239

(56) References Cited

U.S. PATENT DOCUMENTS

| | | |
|---|---|---|
| 4,757,360 A | 7/1988 | Farone |
| 4,794,565 A | 12/1988 | Wu et al. |
| 4,882,707 A | 11/1989 | Mizutani |
| 4,931,847 A | 6/1990 | Corda |
| 4,947,221 A | 8/1990 | Stewart et al. |
| 5,021,848 A | 6/1991 | Chiu |
| 5,029,130 A | 7/1991 | Yeh |
| 5,041,886 A | 8/1991 | Lee |
| 5,101,250 A | 3/1992 | Arima et al. |
| 5,268,319 A | 12/1993 | Harari |
| 5,429,965 A | 7/1995 | Shimoji |
| 5,544,103 A | 8/1996 | Lambertson |
| 5,572,054 A | 11/1996 | Wang et al. |
| 5,780,341 A | 7/1998 | Ogura |
| 5,780,892 A | 7/1998 | Chen |
| 5,789,293 A | 8/1998 | Cho et al. |
| 5,796,139 A | 8/1998 | Fukase |
| 5,808,328 A | 9/1998 | Nishizawa |
| 5,811,853 A | 9/1998 | Wang |
| 5,814,853 A | 9/1998 | Chen |
| 6,091,104 A | 7/2000 | Chen |
| 6,103,573 A | 8/2000 | Harari et al. |
| 6,140,182 A | 10/2000 | Chen |
| 6,222,227 B1 | 4/2001 | Chen |
| 6,541,815 B1 * | 4/2003 | Mandelman et al. ........ 257/315 |
| 6,586,302 B1 * | 7/2003 | Hopper et al. .............. 438/257 |
| 2003/0139010 A1 * | 7/2003 | Wang ......................... 438/257 |

FOREIGN PATENT DOCUMENTS

EP  0 389 721 A2  10/1990

OTHER PUBLICATIONS

U.S. patent application Ser. No. 09/401,622, Johnson, filed Sep. 22, 1999.

* cited by examiner

Primary Examiner—David Nelms
Assistant Examiner—Thao P. Le
(74) Attorney, Agent, or Firm—Grary Cary Ware & Freidenrich LLP

(57) ABSTRACT

A self aligned method of forming a semiconductor memory array of floating gate memory cells in a semiconductor substrate having a plurality of spaced apart isolation regions and active regions on the substrate substantially parallel to one another in the column direction. Floating gates are formed in trenches using a first layer of conducting material at the bottom of the trenches, and a second layer of conducting material along sidewalls of the trenches. An etch process is used to etch away portions of the first and second layers of the conductive material to form floating gate blocks of the conductive material having sloping portions that terminate in pointed edges formed along the trench sidewalls. The sharpness of the pointed edges are enhanced by the presence of the conductive material disposed along the trench sidewalls.

12 Claims, 11 Drawing Sheets

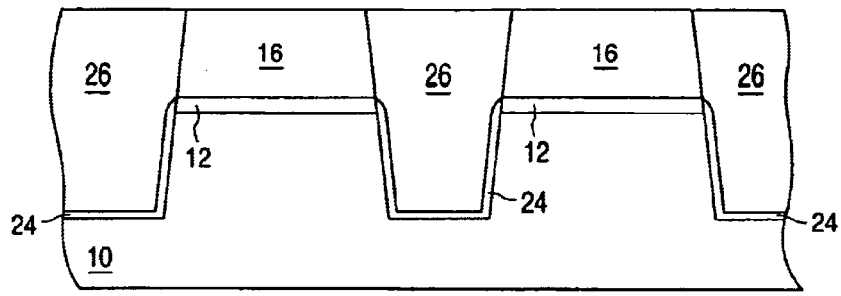
FIG. 2C
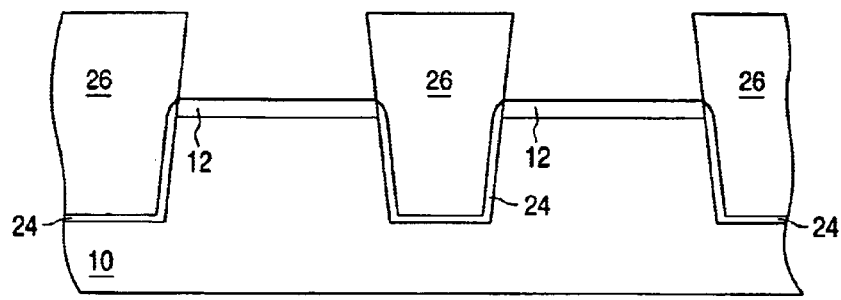
FIG. 2D
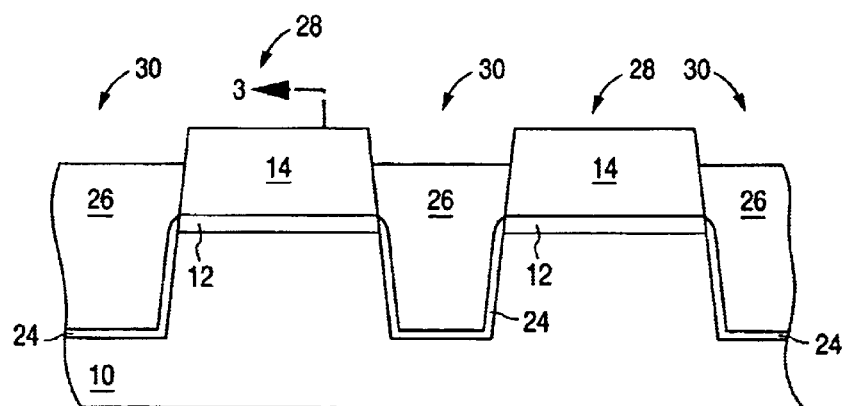
FIG. 2E
FIG. 3A
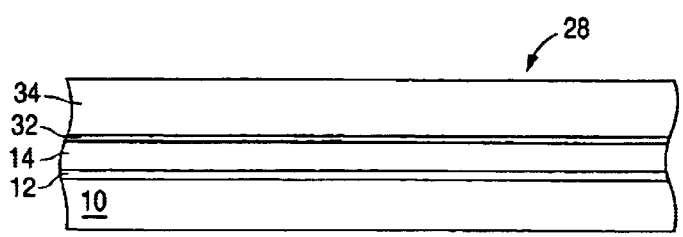

US 6,706,592 B2

SELF ALIGNED METHOD OF FORMING A SEMICONDUCTOR ARRAY OF NON-VOLATILE MEMORY CELLS

TECHNICAL FIELD

The present invention relates to a method of forming an array of semiconductor non-volatile memory cells on a semiconductor substrate.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type, or a combination thereof.

One of the problems facing the manufacturability of semiconductor floating gate memory cell arrays has been the alignment of the various components such as source, drain, control gate, and floating gate. As the design rule of integration of semiconductor processing decreases, reducing the smallest lithographic feature, the need for precise alignment becomes more critical. Alignment of various parts also determines the yield of the manufacturing of the semiconductor products.

Self-alignment is well known in the art. Self-alignment refers to the act of processing one or more steps involving one or more materials such that the features are automatically aligned with respect to one another in that step processing. Accordingly, self alignment minimizes the number of masking steps necessary to form memory cell structures, and enhances the ability to scale such structures down to smaller dimensions.

In the manufacture of memory cell arrays, it is also known to form a pointed edge on the floating gate that faces the control gate, to enhance the erase operation of the memory cell through Fowler-Nordheim tunneling. However, it can be difficult to form floating gate pointed edges having the desired sharpness. Moreover, the sharpness of the floating gate edges can be compromised by subsequent processing steps, such as over-etch processing steps needed to remove residual material (e.g. poly stringers). While there are many processing steps that could be added to form and help maintain the floating gate pointed edge, it is essential to streamline the manufacturing process (minimize material layers, masking steps and etch steps) in order to reduce manufacturing costs and defects, and increase yield.

There is a need for a manufacturing method that efficiently forms non-volatile memory cells with erase enhancing pointed edges, while still minimizing the number of processing steps necessary to reliably manufacture the non-volatile memory cells.

SUMMARY OF THE INVENTION

The present invention provides an improved method of manufacturing an array of semiconductor memory cells, which includes the steps of forming a plurality of spaced apart isolation regions on the substrate of a first conductivity type which are substantially parallel to one another and extend in a first direction, with an active region between each pair of adjacent isolation regions, forming a plurality of spaced apart blocks of conductive material in each of the active regions, wherein each of the conductive material blocks is disposed over and insulated from the substrate, forming a plurality of spaced apart first trenches in a first material in each of the active regions, wherein the conductive material blocks are disposed in the first trenches, etching away a top portion of the conductive material block in each of the first trenches to form sloping portions of the conductive material block therein that terminate in edges extending along sidewalls of the first trenches, removing the first material, forming a plurality of control gates of conductive material each disposed adjacent to and insulated from one of the conductive material blocks, and forming a plurality of spaced apart first and second regions in the substrate in each of the active regions that have a second conductivity type, with channel regions of the substrate defined between the first and second regions. Each of the control gates is disposed over and insulated from a portion of one of the channel regions.

Other objects and features of the present invention will become apparent by a review of the specification, claims and appended figures.

BRIEF DESCRIPTION OF THE DRAWINGS

FIGS. 2A–2E are cross sectional views of the structure in FIG. 1C taken along the line 1—1 showing an alternate process to form the isolation and active regions on the semiconductor substrate.

DETAILED DESCRIPTION OF THE PREFERRED EMBODIMENTS

Figure 1A:
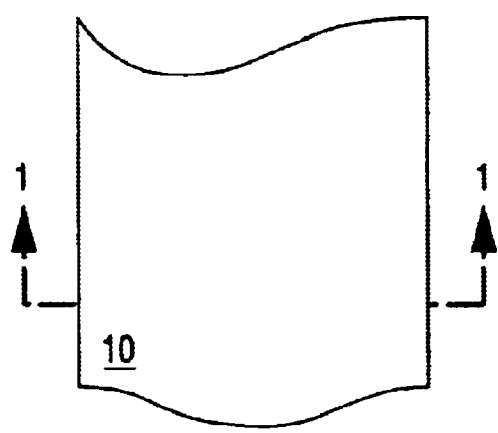
FIG. 1A is a top view of a semiconductor substrate used in the first step of the method of present invention to form isolation regions.
Figure 1B:
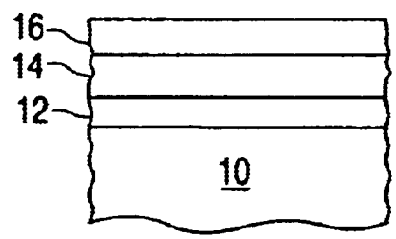
FIG. 1B is a cross sectional view of the structure taken along the line 1—1 showing the initial processing steps of the present invention.

The present invention is a self aligned method of manufacturing an array of non-volatile memory cells. The method avoids excessive processing steps, while providing a pointed edge on the floating gate for enhanced erase operation.
Isolation Region Formation FIGS. 1A to 1G illustrate the formation of isolation regions between the columns of active regions. Referring to FIG. 1A there is shown a top plan view of a semiconductor substrate 10 (or a semiconductor well), which is preferably of P type and is well known in the art. A first layer of insulation material 12, such as silicon dioxide (hereinafter "oxide"), is deposited thereon as shown in FIG. 1B. The insulation layer 12 is formed on the substrate 10 by well known techniques such as oxidation or deposition (e.g. chemical vapor deposition or CVD), forming a layer of oxide (for example 5–10 nm thick). A layer of polysilicon 14 (hereinafter "poly") is deposited on top of the oxide layer 12 (e.g. 30–100 nm thick). Poly layer 14 can be doped after deposition, or in-situ doped. The deposition and formation of poly layer 14 on oxide layer 12 can be made by a well known process such as Low Pressure CVD or LPCVD. A silicon nitride layer 16 (hereinafter "nitride") is deposited on the poly layer 14, preferably by CVD (e.g. 100–200 nm thick). This nitride layer 16 is used to define the active regions during isolation formation. Of course, all of the forgoing described parameters and the parameters described hereinafter, depend upon the design rules and the process technology generation. What is described herein is for a 0.09 to 0.25 micron process. However, it will be understood by those skilled in the art that the present invention is not limited to any specific process technology generation, nor to any specific value in any of the process parameters described herein.

Figure 1C:
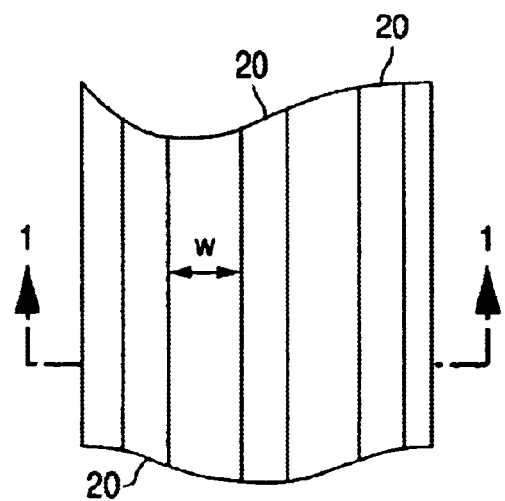
FIG. 1C is a top view of the structure showing the next step in the processing of the structure of FIG. 1B, in which isolation regions are formed.
Figure 1D:
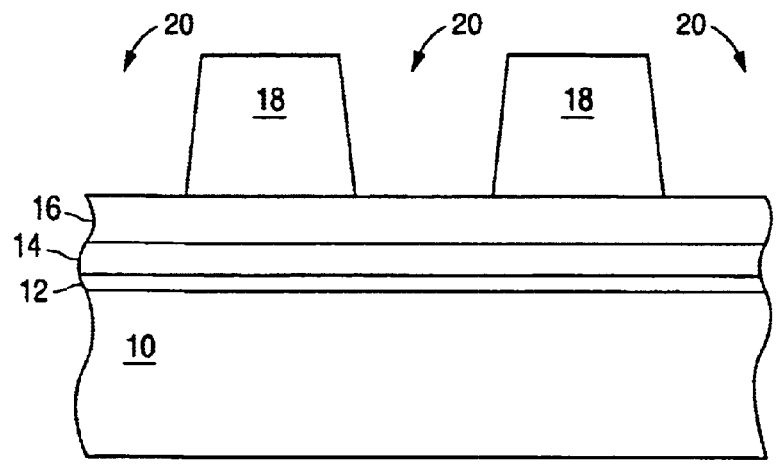
FIGS. 1D–1G are cross sectional views of the structure in FIG. 1C taken along the line 1—1 showing the formation of the isolation and active regions on the semiconductor substrate.

Once the oxide layer 12, the poly layer 14, and the nitride layer 16 have been formed, suitable photo resist (masking) material 18 is applied on the nitride layer 16 and a masking step is performed to selectively remove the photo resist material from certain regions (stripes 20), as shown in FIGS. 1C and 1D. Where the photo resist material 18 is removed, the underlying nitride layer 16, the poly layer 14 and oxide layer 12 are left exposed in stripes 20 formed in the Y or column direction. The distance W between adjacent stripes 20 can be as small as-the smallest lithographic feature of the process used.

Figure 1E:
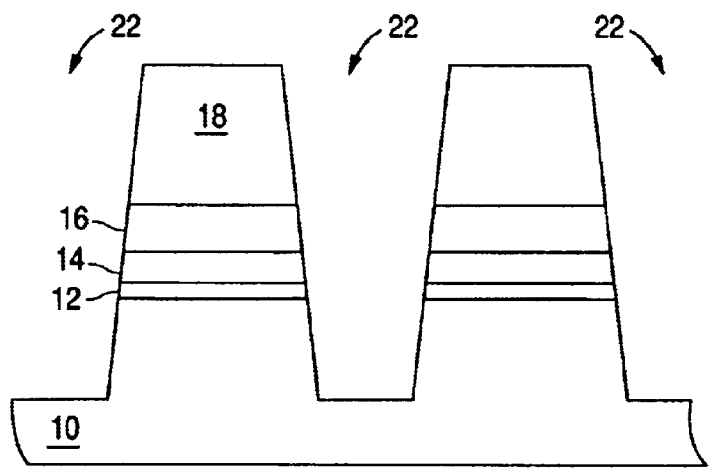

Standard nitride, poly and oxide etching techniques (i.e. anisotropic etch processes) are then used to remove the exposed portions of nitride 16, poly 14 and oxide 12 in stripe regions 20 to form isolation trenches 22 in the structure, leaving the substrate 10 exposed at the bottom of each isolation trench 22. A silicon trench etch process is next used to etch away exposed portions of substrate 10, to extend isolation trenches 22 into substrate 10 (e.g. to a depth of ~200–400 nm), as shown in FIG. 1E. Where the photo resist 18 was not removed, the underlying portions of nitride layer 16, poly layer 14 and oxide layer 12 are maintained. The photo resist 18 can be removed next, or could be removed prior to the silicon trench etch using nitride 16 as a hard mask.

Figure 1F:
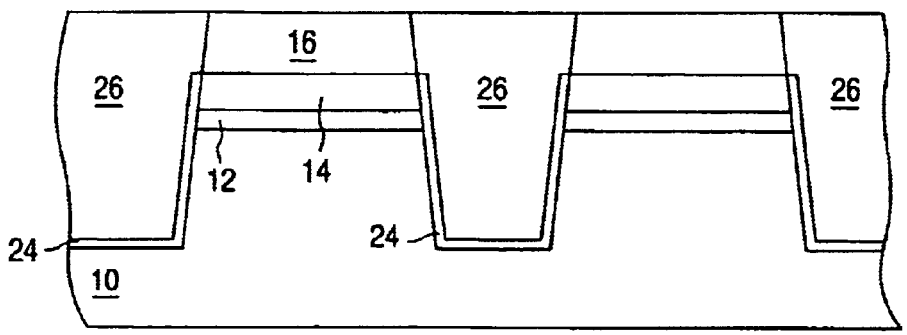

After the remaining photo resist 18 is removed, a thin layer of oxide 24 is formed over the structure to line the surfaces (side and bottom walls) of isolation trenches 22 with oxide 24 (e.g. using a conventional thermal oxidation process). A thick layer of (shallow trench isolation-STI) oxide is deposited over the structure, followed by a Chemical-Mechanical-Polishing (CMP) etch, using nitride layer 16 as an etch stop, which removes all of the deposited oxide except for oxide blocks 26 (that fill the isolation trenches 22). The resulting structure is shown in FIG. 1F.

An optional oxide etch process follows, to etch down oxide blocks 26 approximately even with poly layer 14. A nitride etch is performed next, to remove nitride layer 16, resulting in the structure shown in FIG. 1G. At this point, the substrate 10 has alternating stripes of active regions 28 (in which poly layer 14 and oxide layer 12 are intact for memory cell formation) and isolation regions 30 (containing insulating oxide blocks 26).

Figure 2A:
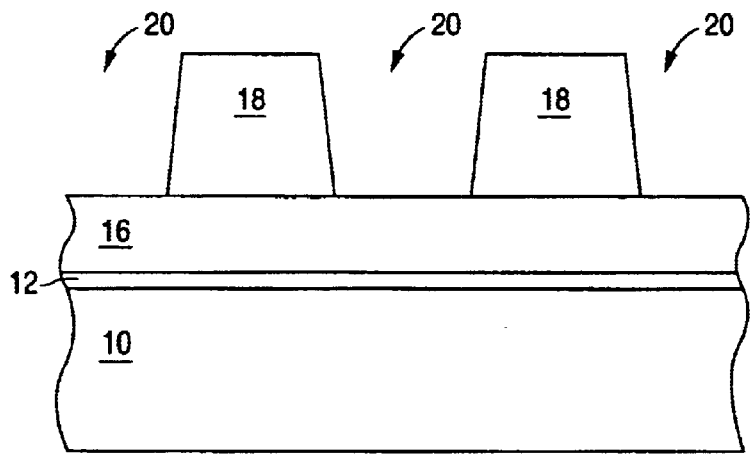

FIGS. 2A to 2E illustrate an alternate method of forming the active and isolation regions 28/30 on substrate 10. As shown in FIG. 2A, this alternate method begins with the same structure as shown in 1D, except that nitride layer 16 is formed directly onto oxide layer 12 (without any poly layer 14 therebetween).

Figure 2B:
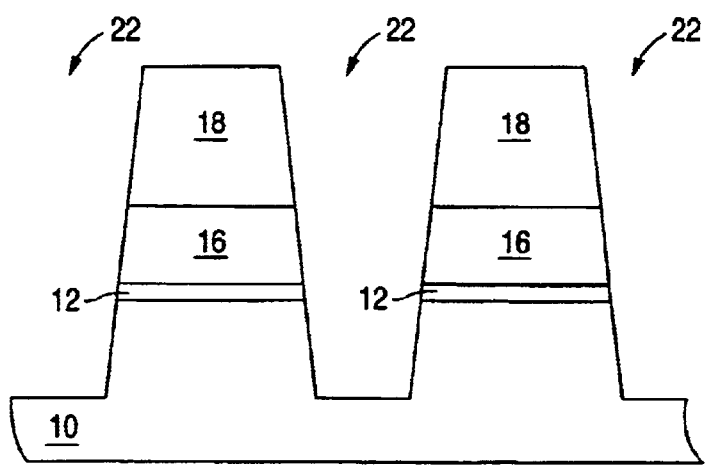

Standard nitride, oxide, and silicon etching techniques (i.e. anisotropic etch processes) are used to form the isolation trenches 22 that extend into substrate 10, as shown in FIG. 2B. After the photo resist 18 is removed, the thin oxide layer 24 is formed in isolation trenches 22, either by conventional oxide deposition, or by thermal oxidation as shown in FIG. 2C. The STI oxide blocks 26 are then formed by depositing oxide over the structure, followed by a CMP etch that uses nitride layer 16 as an etch stop. The resulting structure is shown in FIG. 2C.

A nitride etch is used to remove the remaining portions of nitride layer 16, as shown in FIG. 2D. An oxide etch is then used to remove oxide layer 12, leaving substrate 10 exposed between oxide blocks 26. An optional sacrificial layer of oxide can be grown on the exposed substrate portions and then removed with an oxide etch. Oxide layer 12 is then re-formed on the exposed substrate either by oxide deposition or by a thermal oxidation process, with the desired thickness for the memory cells to be formed thereon. The optional sacrificial oxide layer improves the integrity of the re-formed oxide layer 12. The resulting structure is shown in FIG. 2D.

A thick layer of polysilicon is then deposited over the structure, followed by a poly CMP etch using oxide blocks 26 as an etch stop, to form poly layer 14 in the active regions. Poly layer 14 can be doped after deposition, or in-situ doped. An optional oxide etch process follows, to recess the oxide blocks 26 below the tops of poly layer 14 in the active regions 28. The resulting structure is shown in FIG. 2E.

Memory Array Formation

Figure 1G:
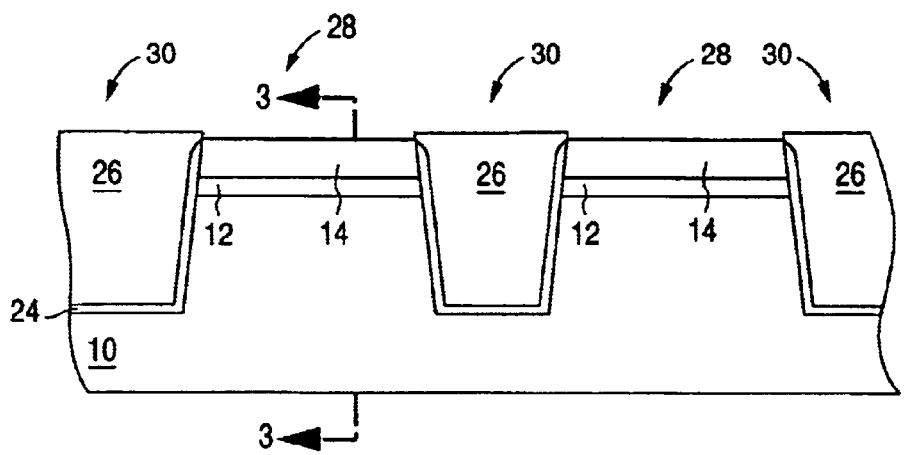
Figure 3B:
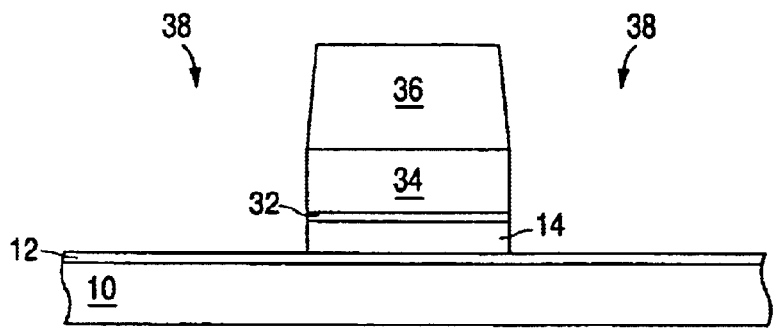
FIGS. 3A–3R are cross sectional views taken along the line 3—3 of FIGS. 1G/2E showing in sequence the next step(s) in the processing of the structure shown in FIG. 1G or 2E, in the formation of a non-volatile memory array of floating gate memory cells of the present invention.
FIG. 3S is a top view showing the interconnection of row lines and bit lines to the active regions in the formation of the non-volatile memory array of floating memory cells of the present invention.
Figure 3C:
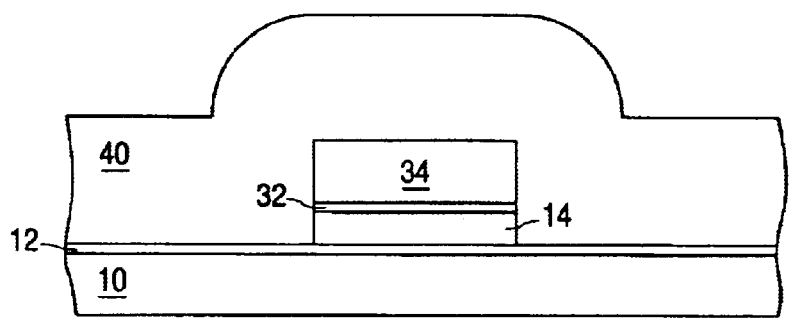
Figure 3D:
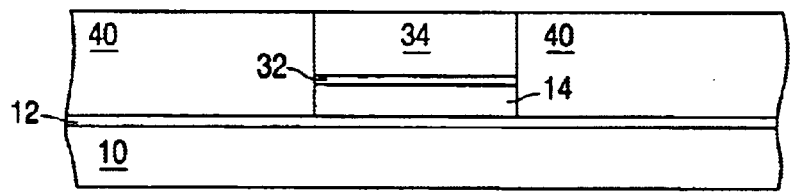
Figure 3E:
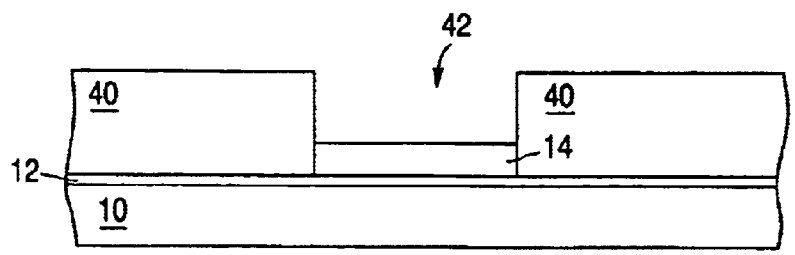

With either of the structures shown in FIG. 1G or 2E, the structure is further processed as follows. FIGS. 3A to 3R show the cross section of the active region structure 28 from a view orthogonal to that of FIG. 1G or 2E along the line 3—3, as the next steps in the process of the present invention are performed. It should be appreciated that while only a portion of a single active region 28 is shown, the processing steps illustrated below form an array of such regions.

An optional thin layer of nitride 32 is formed on poly layer 14, followed by the formation of an oxide layer 34 formed on the nitride layer 32 (e.g. nitride layer 32 is 10–50 nm thick, and oxide layer 34 is 150–400 nm thick). The resulting structure in the active regions 28 is shown in FIG. 3A.

A masking operation is performed by first applying photo resist (masking) material 36 on oxide layer 34. A masking step is applied to the structure to remove the photo resist 36 in parallel stripe regions to form (second) trenches 38 that extend in the X or the row direction (perpendicular to the active regions 28). Anisotropic oxide, nitride and poly etches are performed to remove the exposed portions of oxide layer 34, nitride layer 32 and poly layer 14 in trenches 38 (i.e. those portions not protected by photo resist 36). The nitride layer 32 is used as an etch stop for the oxide etch, and prevents the oxide etch from consuming any of the STI oxide blocks 26 in the isolation regions 30. An optional oxide etch can be performed before the poly etch if it is desired to recess the STI oxide blocks 26 opposite the drain areas of the active regions 28. The resulting structure is shown in FIG. 3B.

The remaining photo resist 36 is stripped from the structure. A thick layer of nitride 40 is then deposited over the structure, as shown in FIG. 3C. The structure is then planarized using a nitride CMP etch (with oxide 34 as an etch stop), as shown in FIG. 3D. The planarizing etch leaves nitride blocks 40 on either side of oxide block 34. An oxide etch (e.g. wet etch) follows to remove oxide block 34 (nitride layer 32 is used as an etch stop to prevent the STI oxide blocks 26 from being etched). A nitride etch is next to remove nitride layer 32. The resulting structure is shown in FIG. 3E. These oxide and nitride etches form (first) trench 42 between nitride blocks 40 that extends down to and exposes poly layer 14.

Figure 3F:
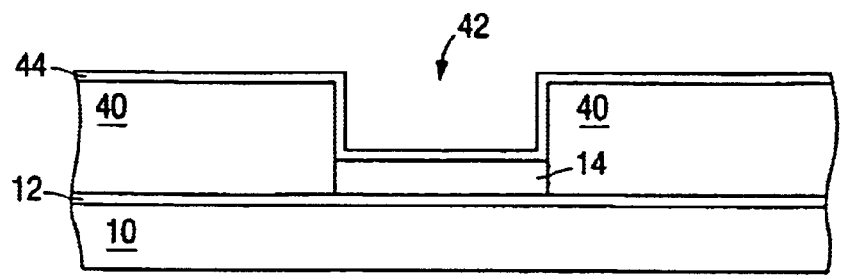
Figure 3G:
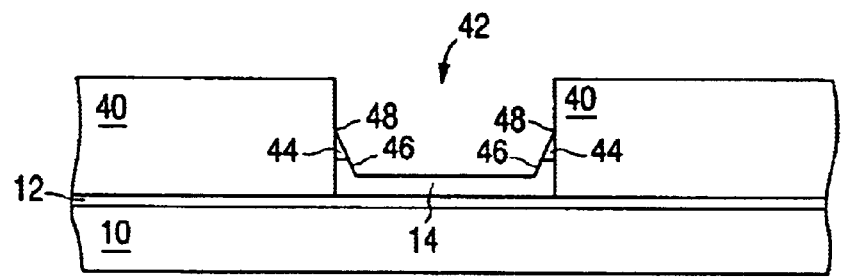

An optional thin poly layer 44 (~5–50 nm thick) is deposited over the structure, including on poly layer 14 and on surfaces (i.e. sidewalls) of trenches 42, as shown in FIG. 3F. This poly layer is either doped or in-situ doped. A controlled anisotropic poly etch is then performed, which removes some of the exposed portions of poly layers 44 and 14, leaving a (floating gate) block of the conductive material that includes portions of both poly layers 14/44 (the poly block 14/44 eventually will be divided into two separate floating gates as detailed below). The anisotropic poly etch is less effective in removing poly material disposed adjacent the first trench sidewalls. Thus, portions of thin poly layer 44 disposed adjacent the sidewall of trench 42 remain, and help form sloping portions 46 of poly layer blocks 14/44 that terminate in pointed edges 48. The presence of thin poly layer 44 makes the sharpness of edges 48 more pronounced, as this material enhances the slope of sloping portions 46 and forms the tip of pointed edges 48. The resulting structure is shown in FIG. 3G.

Figure 3H:
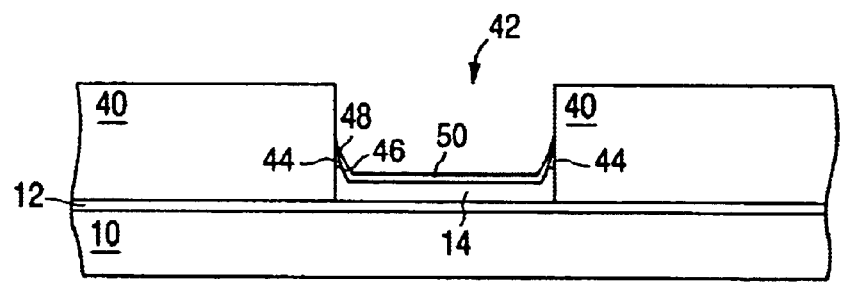
Figure 3I:
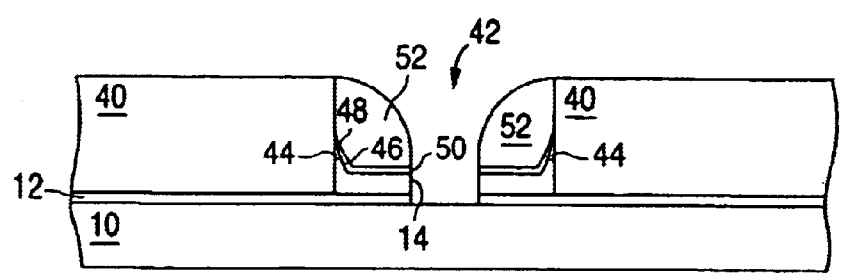

An optional thermal oxidation process is used to grow a thin oxide layer 50 (~2 to 30 nm) on poly layer blocks 14/44, as shown in FIG. 3H. Oxide spacers 52 are then formed inside trench 42. The formation of spacers is well known in the art, and includes depositing a material over the contour of a structure, followed by an anisotropic etch process (e.g. RIE), whereby the material is removed from horizontal surfaces of the structure, while the material remains largely intact on vertically oriented surfaces of the structure. To form oxide spacers 52, a thick layer of oxide is deposited over the structure, followed by an anisotropic oxide etch, which removes the deposited oxide except for spacers 52 inside trench 42. This oxide etch step also removes the center portion of oxide layer 50 from trench 42 to expose poly layer 14. The oxide etch step uses the nitride layer 40 as the etch stop. An anisotropic poly etch follows, which removes the exposed portions of poly layer 14 inside trench 42 (between oxide spacers 52), exposing oxide layer 12. An oxide etch is next, which removes the exposed portions of oxide layer 12 inside trench 42 (between oxide spacers 52), exposing the substrate 10. The resulting structure is shown in FIG. 3I.

Figure 3J:
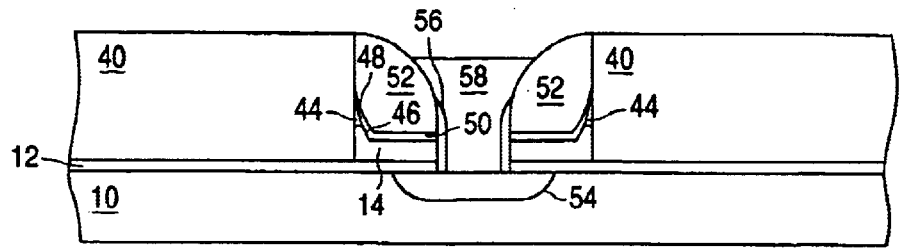

Suitable ion implantation is then made across the entire surface of the structure, where the ions form first regions (i.e. source regions) 54 in the portions of substrate 10 exposed in trenches 42. In all other regions, the ions are absorbed by the existing structure, where they have no effect. Insulation spacers 56 (e.g. oxide, nitride, or both) are then formed inside trench 42 by depositing a layer of insulating material, followed by an anisotropic etch, which removes the deposited insulating material except for spacers 56 along the sidewall of trench 42. Source region 54 can be formed after the formation insulation spacers 56 as well. Trench 42 is then filled with a conductive material (e.g. poly) by depositing a thick poly layer over the structure, followed by a CMP and/or poly etch that removes the deposited poly material except for poly block 58 in trench 42. Poly block 58 is in electrical contact with first (source) region 54. The resulting active region structure is shown in FIG. 3J.

Figure 3K:
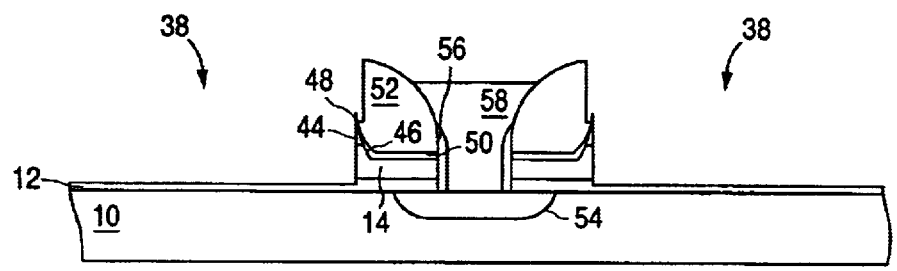
Figure 3L:
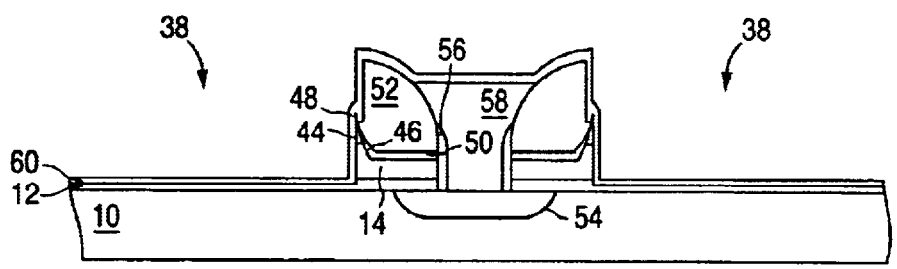

Next, a nitride etch is used to remove nitride layer 40 (which reforms second trenches 38). A light oxide etch is used to consume a small portion of the oxide spacers 52, which exposes pointed edges 48, as shown in FIG. 3K. This oxide etch also consumes some of the exposed portions of oxide layer 12. An oxide layer 60 is then deposited over the structure, as shown in FIG. 3L. The pointed edges 48 and the thickness of the insulation layer 60 permit Fowler-Nordheim tunneling of charges therethrough.

Figure 3M:
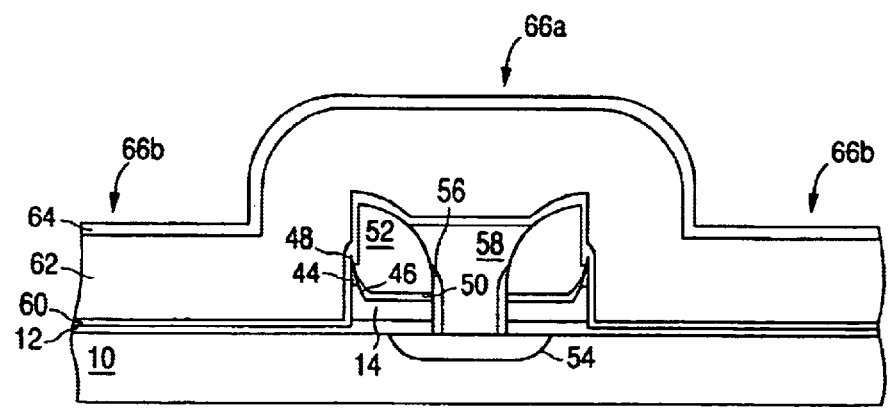

A thick WL poly layer 62 is formed over the structure (filling trenches 38), which is followed by the formation of a nitride layer 64 on the poly layer 62 (e.g. 10–300 nm thick), as illustrated in FIG. 3M. For each memory cell pair, the resulting structure has a raised central portion 66a and lower side portions 66b.

Figure 3N:
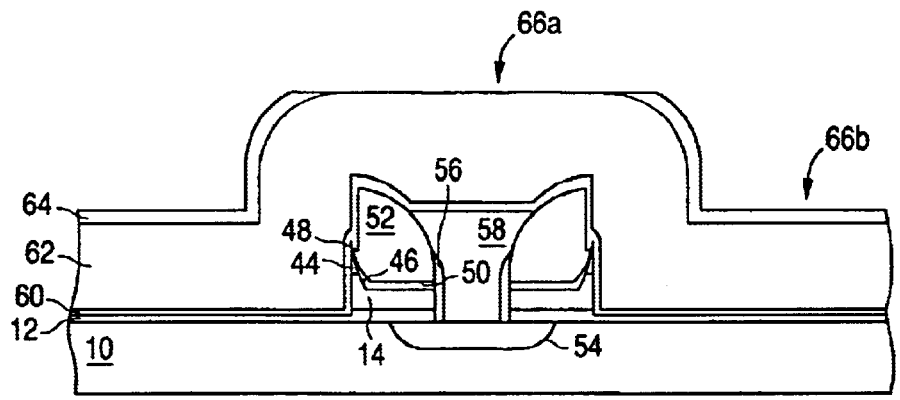
Figure 3O:
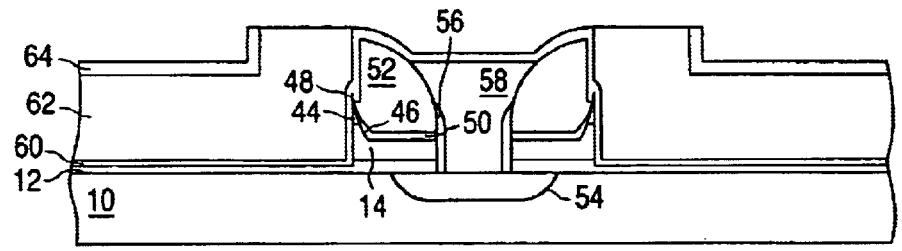

A planarization process follows, such as CMP, which removes the nitride layer 64 portion over raised central portions 66a, as shown in FIG. 3N. The process is continued to remove the raised central portions of poly layer 62 and nitride layer 64 thereon, using oxide layer 60 as an etch stop, as shown in FIG. 3O. It is preferred that the slurry chosen for this CMP process should not etch nitride, but rather etch polysilicon only. Most of the mechanical polishing stress is applied to the poly layer 62, and it is undesirable to have the slurry etch away the relatively thin nitride layer 64 on the lower portions 66b. Preferably, the nitride layer 64 is removed mainly by mechanical polishing, so that once this CMP process is complete, portions of nitride layer 64 on the lower side portions 66b of poly layer 62 remain intact (to later serve as an oxidation protection layer).

Figure 3P:
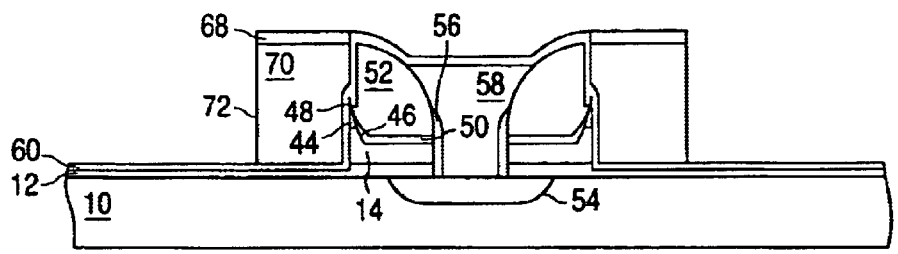

Poly layer 62 is partially covered and protected by nitride layer 64, with other portions that are left exposed by the CMP process. A layer of oxide 68 is formed on those exposed portions of poly layer 62, for example using a thermal oxidation step (e.g. 8–80 nm thick). A nitride etch process follows, which removes nitride layer 64. An anisotropic poly etch step is then performed to remove the exposed portions of poly layer 62 (i.e. those portions not protected by oxide layer 68). The remaining portions of poly layer 62 (under oxide layer 68) form poly blocks 70, as shown in FIG. 3P. Poly blocks 70 have vertical side walls 72 resulting from the anisotropic etch and protective oxide layer 68.

Figure 3Q:
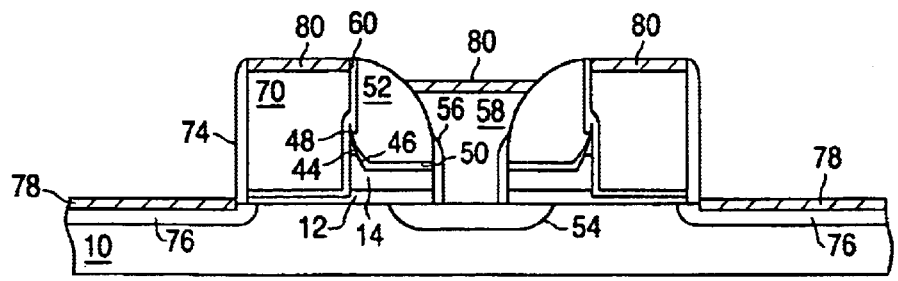
Figure 3R:
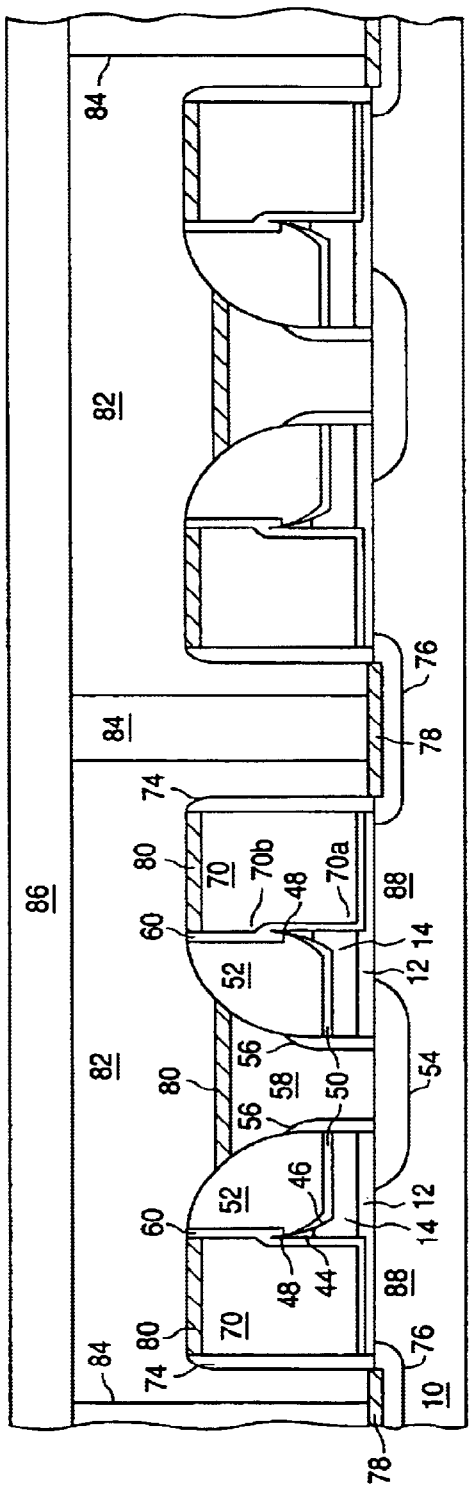

Optional insulation side wall spacers 74 (e.g. nitride or oxide) can be formed adjacent vertical side walls 72 of poly blocks 70 by forming insulating material over the structure followed by an anisotropic etch (such as RIE dry etch) to remove all the deposited insulating material except for side wall spacers 74. Ion implantation (e.g. N+) is used to form second regions (i.e. drain regions) 76 in the substrate in the same manner as the first regions 54 were formed. A thin oxide etch is performed to remove the exposed portions of oxide layers 60, 12 and 68, leaving poly blocks 58/70 and portions of substrate 10 exposed. A metal deposition step is then performed, to deposit a metal such as tungsten, cobalt, titanium, nickel, platinum, or molybdenum over the structure. The structure is then annealed, permitting the metal to react with the exposed top portions of the substrate 10 and poly blocks 58/70 to form a conductive layer of metalized silicon 78 (silicide) on the substrate next side wall spacers 74, and a conductive layer of metalized silicon (silicide) 80 on the poly blocks 58/70, as shown in FIG. 3Q. Silicide 78 can be called self aligned silicide (i.e. salicide), because it is self aligned to the second regions 76 by spacers 74. Silicide 80 is also self aligned on the top surfaces of poly blocks 58/70, and facilitates conduction along the length of these poly blocks. The un-reacted metal deposited on the remaining structure is removed by a metal etch process.

An interlayer dielectric 82, such as oxide, is used to cover the entire structure. A masking step is performed to define etching areas over the salicide regions 78. The oxide 82 is selectively etched in the masked regions to create contact openings that extend down to salicide regions 78 formed between adjacent sets of paired memory cells. The contact openings are then filled with a conductor metal (e.g. tungsten) to form metal contacts 84 that are electrically connected to salicide regions 78. The salicide layers 78 facilitate conduction between the contacts 84 and second regions 76. Bit lines 86 are added by metal masking over the oxide 82, to connect together all the contacts 84 in each active region. The final memory cell structure is illustrated in FIG. 3R.

As shown in FIG. 3R, first and second regions 54/76 form the source and drain for each memory cell (those skilled in the art know that source and drain can be switched during operation). A channel region 88 for each cell is defined as the portion of the substrate that is in-between the source and drain regions 54/76. Poly blocks 70 constitute the control gates, and poly layer block 14/44 constitutes the floating gate. The control gates 70 are generally rectangular in shape, each with a lower first portion 70a that is disposed laterally adjacent to one of the floating gates 14/44 (insulated therefrom by oxide layer 60), and an upper second portion 70b that protrudes over pointed edge 48 of floating gate 14/44. Each floating gate 14/44 is disposed over and insulated from a portion of the channel region 88, is partially overlapped at one end by one of the control gates 70, and partially overlaps one of the first regions 54 with its other end. As illustrated in the FIG. 3R, the process of the present invention forms pairs of memory cells that mirror each other. Each pair of mirrored memory cells is insulated from adjacent pairs of mirrored memory cells by spacers 74 and oxide 82.

The result is a plurality of non-volatile memory cells of the split gate type. The control gates 70 in each row of memory cells are integrally formed together to form a control gate line that extends along the length of the row direction (across the active and isolation regions) connecting together all the control gates in that same row. A source line 58 runs along the row direction as well, connecting the first regions 54 of pairs of memory cells in the same row direction. A bit line 86 runs along the column or Y direction, connecting the second regions 76 of pairs of memory cells in the same active region. The formation of the control gate, the floating gate, the source line, and the bit line, are all self-aligned. The non-volatile memory cell is of the split gate type having floating gate to control gate tunneling as described in U.S. Pat. No. 5,572,054, whose disclosure is incorporated herein by reference with regard to the operation of such a non-volatile memory cell and an array formed thereby.

Figure 3S:
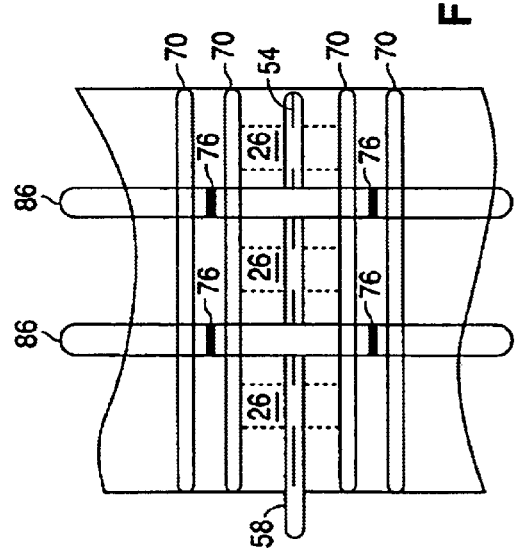

Referring to FIG. 3S, there is shown a top plan view of the resulting structure and the interconnection of the bit lines 86 to the second regions 76 and of the control lines 70 which run in the X or the row direction, and finally the source lines 58 which connect to the first regions 54 within the substrate 10. Although the source lines 58 (as should be understood by those skilled in the art, the word "source" is interchangeable with the word "drain") make contact with the substrate 10 in the entire row direction (i.e. contact with the active regions as well as the isolation regions), the source lines 58 electrically connect only to the first regions 54 in the substrate 10. In addition, each first region 54 to which the "source" line 58 is connected is shared between two adjacent memory cells. Similarly, each second region 76 to which the bit line 86 is connected is shared between adjacent memory cells from different mirror sets of memory cells.

Keys features of the present invention include the formation of a protective layer or layers over the polysilicon that forms the control gates, and etching the remaining unprotected polysilicon, so that the control gates each have a planar vertical sidewall that is conducive to spacer formation. Further, the sharpness of floating gate pointed edges 48 is accentuated by forming these pointed edges using a poly etch process on a poly block in a trench. The pointed edges are further accentuated by the deposition of the optional thin poly layer on the trench walls before the poly etch. Together, these steps can tolerate a large process variation window, and forming sharp edges using an etch step in a trench has been found to allow better optimization of the manufacturing process. Moreover, the poly etch used to form poly blocks 70 can be an extended over-etch of polysilicon, to remove any poly stringers from the drain region, without adversely affecting the poly blocks 70 or the floating gate pointed edges 48 (which are protected by oxide layers 60 and 68).

Alternate Embodiment

Figure 4A:
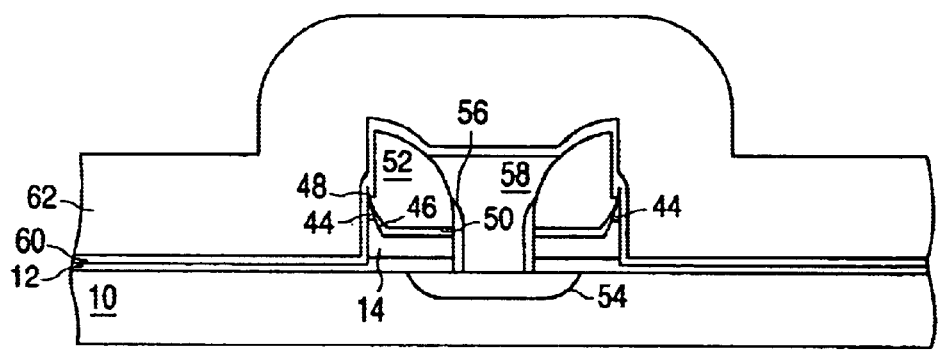
FIGS. 4A–4E are cross sectional views taken along the line 3—3 of FIGS. 1G/2E showing in sequence the next step(s) in a first alternate processing of the structure shown in FIG. 3M, in the formation of a non-volatile memory array of floating gate memory cells of the present invention.

FIGS. 4A–4E illustrate an alternate process for forming a memory cell array similar to that illustrated in FIG. 3R, but with the control gates formed as spacers instead of as rectangular-like blocks. This alternate process begins with the same structure as shown in FIG. 3M, but without the formation of nitride layer 64, as shown in FIG. 4A.

Figure 4B:
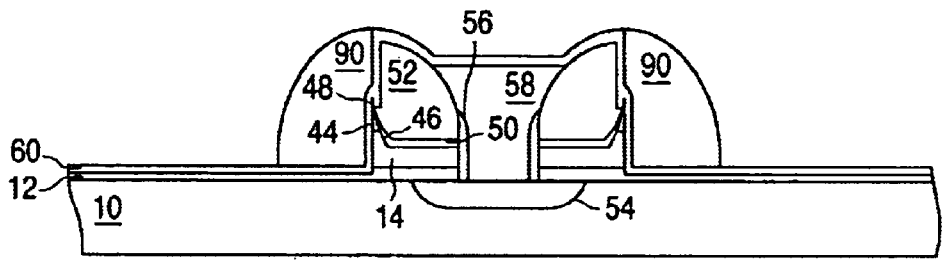
Figure 4C:
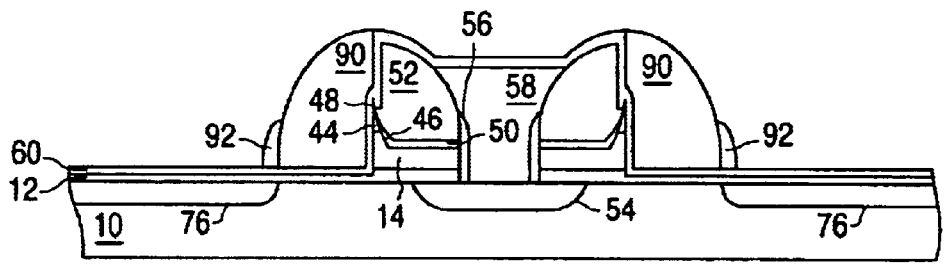

A dry poly etch process is applied to the structure to remove poly layer 62 except for poly spacers 90 formed against vertical portions of oxide layer 60, as shown in FIG. 4B. Insulating material (e.g. nitride or oxide) is formed over the structure, followed by an anisotropic etch (such as RIE dry etch) to remove the deposited insulating material except for spacers 92 adjacent poly spacers 90. Ion implantation (e.g. N+) is then used to form the second regions (i.e. drain regions) 76 in the same manner as the first regions 54 were formed. The resulting structure is shown in FIG. 4C.

Figure 4D:
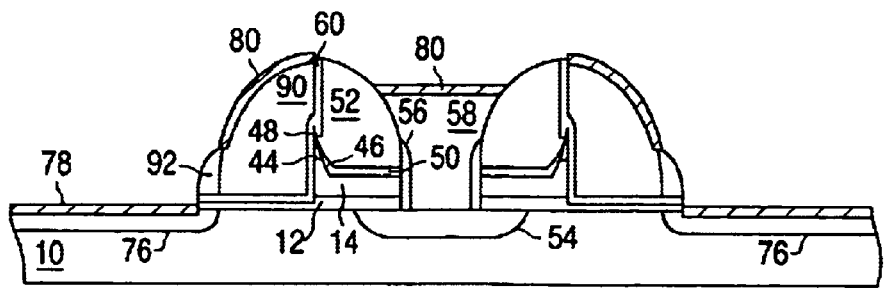
Figure 4E:
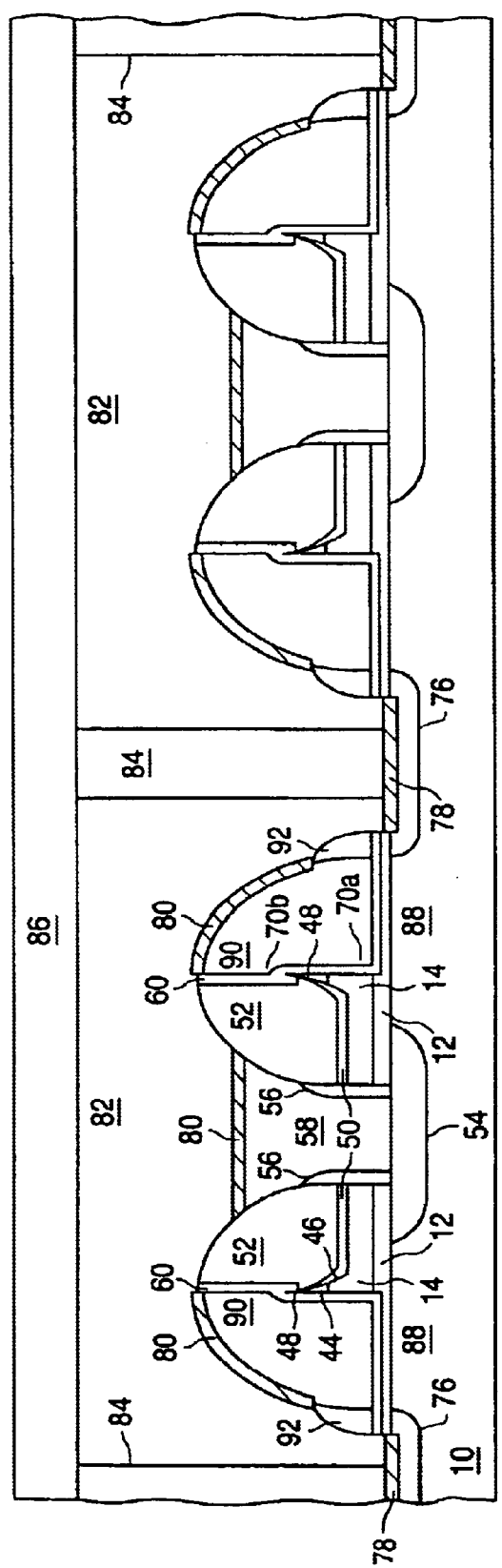

A thin oxide etch is performed to remove the exposed portions of oxide layers 60 and 12. A metal deposition and anneal process is then performed, to form silicide regions 78 on second regions 76 of substrate 10, and to form silicide regions 80 on exposed portions of poly block 58 and poly spacers 90. The remaining metal deposited on the remaining structure is removed by a metal etch process. The resulting structure is shown in FIG. 4D. The remaining processing steps discussed above with respect to FIG. 3R are then performed to complete the memory cell array as shown in FIG. 4E.

It is to be understood that the present invention is not limited to the embodiments described above and illustrated herein, but encompasses any and all variations falling within the scope of the appended claims. For example, although the foregoing method describes the use of appropriately doped polysilicon as the conductive material used to form the memory cell control gates, it should be clear to those having ordinary skill in the art that any appropriate conductive material can be used. In addition, any appropriate insulator can be used in place of silicon dioxide or silicon nitride. It should be understood that while the figures show the substrate uniformly doped, it is well known that any and/or all of the regions formed therein (source, drain, channel region, etc.) can be formed in one or more well regions (of differently doped silicon). Finally, although STI oxide deposition is used to fill the isolation trenches, thermal oxidation can be used to form the insulating material inside isolation trenches instead of oxide deposition.

What is claimed is:

1. A method of forming an array of semiconductor memory cells, comprising the steps of:

forming a plurality of spaced apart isolation regions on the substrate of a first conductivity type which are substantially parallel to one another and extend in a first direction, with an active region between each pair of adjacent isolation regions;

forming a plurality of spaced apart blocks of conductive material in each of the active regions, wherein each of the conductive material blocks is disposed over and insulated from the substrate;

forming a plurality of spaced apart first trenches in a first material in each of the active regions, wherein the conductive material blocks are disposed in the first trenches;

etching away a top portion of the conductive material block in each of the first trenches to form sloping portions of the conductive material block therein that terminate in edges extending along sidewalls of the first trenches;

removing the first material;

forming a plurality of control gates of conductive material each disposed adjacent to and insulated from one of the conductive material blocks; and forming a plurality of spaced apart first and second regions in the substrate in each of the active regions that have a second conductivity type, with channel regions of the substrate defined between the first and second regions, wherein each of the control gates is disposed over and insulated from a portion of one of the channel regions.

2. The method of claim 1, further comprising the step of:

forming a layer of the conductive material in each of the first trenches that is disposed on the conductive material block and on the sidewalls of the first trenches; and the etching of the conductive material blocks includes etching away portions of the conductive material layer in each of the first trenches so that each of the sloping portions includes portions of both the conductive material block and the conductive material layer, and so that each of the edges includes at least a portion of the conductive material layer.

3. The method of claim 2, further comprising the step of:

forming an insulating material over each of the conductive material blocks.

4. The method of claim 3, wherein the formation of the insulating material over the conductive material blocks includes the step of:

oxidizing a top surface of each of the conductive material blocks.

5. The method of claim 1, wherein the formation of the conductive material blocks and the first trenches includes the steps of:

forming a first layer of conductive material over and insulated from the substrate;

forming a second material on the first layer of conductive material;

forming parallel stripes of masking material each extending in a second direction perpendicular to the first direction across the active and isolation regions;

forming second trenches between each adjacent pair of the masking material stripes that extend through the second material and the first layer of conductive material;

removing the masking material;

forming the first material in the second trenches; and removing the second material.

6. The method of claim 5, wherein the formation of the second material includes the steps of:

forming a layer of a first insulating material on the first layer of conductive material; and forming a layer of a second insulating material on the layer of first insulating material.

7. The method of claim 5, wherein the formation of the control gates includes the steps of:

removing the first material from the second trenches;

forming a second layer of conductive material in the second trenches; and performing an anisotropic etch to remove the second layer of conductive material in the second trenches except for spacers of the conductive material each disposed adjacent to and insulated from one of the conductive material blocks.

8. The method of claim 5, wherein the formation of the control gates includes the steps of:

removing the first material from the second trenches;

forming second blocks of conductive material in the second trenches;

forming a protective layer of material over a first portion of each of the second blocks of conductive material, wherein a second portion of each of the second blocks of conductive material is left uncovered by the layer of protective material; and etching away the second portions of the second blocks of conductive material to form the control gates, wherein each of the control gates has a substantially planar sidewall portion.

9. The method of claim 1, wherein for each of the first trenches, further comprising the steps of:

forming opposing spacers of insulating material against sidewalls of the first trench and over a portion of the conductive material block therein, wherein a portion of the conductive material block is left exposed between the opposing spacers; and removing the exposed portion of the conductive material block to form a pair of separate blocks of the conducting material in each of the first trenches.

10. The method of claim 9, wherein for each of the first trenches, further comprising the step of:

forming a second block of conductive material between the opposing spacers that extends down to and makes electrical contact with one of the first regions in the substrate, wherein the second block of conductive material is insulated from the pair of separate blocks of the conductive material.

11. The method of claim 1, wherein the formation of the isolation regions includes the steps of:

forming a first layer of conductive material over and insulated from the substrate;

forming parallel stripes of masking material each extending in the first direction and disposed over the active regions;

forming an isolation trench between each adjacent pair of the masking material stripes that extends through the first layer of conductive material and into the surface of the substrate;

removing the masking material;

forming a layer of insulating material on surfaces of the isolation trenches; and forming blocks of insulating material in the isolation trenches;

wherein the conductive material blocks are formed from the first layer of conductive material.

12. The method of claim 1, wherein the formation of the isolation regions includes the steps of:

forming a second material over the substrate;

forming parallel stripes of masking material over the second material each extending in the first direction;

forming an isolation trench between each adjacent pair of the masking material stripes that extends through the second material and into the surface of the substrate;

removing the masking material;

forming a layer of insulating material on surfaces of the isolation trenches;

forming blocks of insulating material in the isolation trenches;

removing the second material to form active region trenches between the insulating material blocks; and forming a first layer of conductive material in the active region trenches between the insulating material blocks;

wherein the conductive material blocks are formed from the first layer of conductive material.

* * * * *